United States Patent [19]

McIver et al.

[11] Patent Number: 5,239,186
[45] Date of Patent: Aug. 24, 1993

[54] COMPOSITE QUANTUM WELL INFRARED DETECTOR

[75] Inventors: George W. McIver, Redondo Beach; Dwight C. Streit, Long Beach, both of Calif.

[73] Assignee: TRW Inc., Redondo Beach, Calif.

[21] Appl. No.: 750,134

[22] Filed: Aug. 26, 1991

[51] Int. Cl.5 .................... H01L 29/205; H01L 31/04
[52] U.S. Cl. ........................ 257/21; 257/17; 257/184
[58] Field of Search .................. 357/30, 4, 16

[56] References Cited

U.S. PATENT DOCUMENTS 4,894,526  1/1990  Bethea et al. ............... 357/30
4,914,488  4/1990  Yamave et al. .............. 357/16
5,093,695  3/1992  Cunningham ............... 357/4

Primary Examiner—Jerome Jackson
Attorney, Agent, or Firm—G. Gregory Schivley; Ronald L. Taylor

[57] ABSTRACT

This invention discloses a multiple quantum well infrared detector comprising a series of alternating layers of blocking layers and composite well layers. Each composite well layer is comprised of alternating layers of GaAs and AlGaAs forming a tightly coupled well group. The tightly coupled well group allows more allowed states for an electron released from the valence bands of the gallium arsenide semiconductor material. Consequently, there is a wider band width of detectable infrared radiation by the composite wall structure over the single well of the prior art.

12 Claims, 3 Drawing Sheets

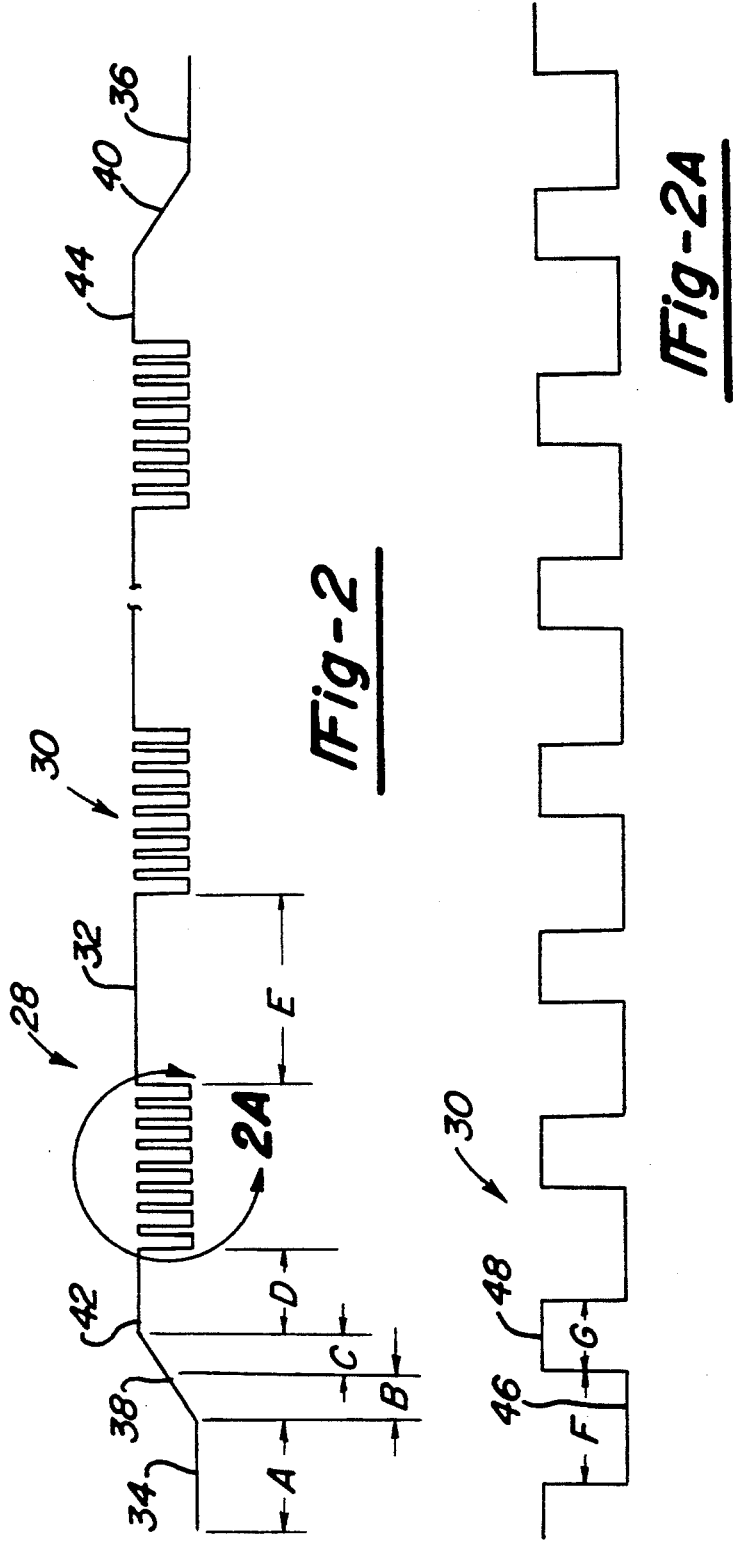

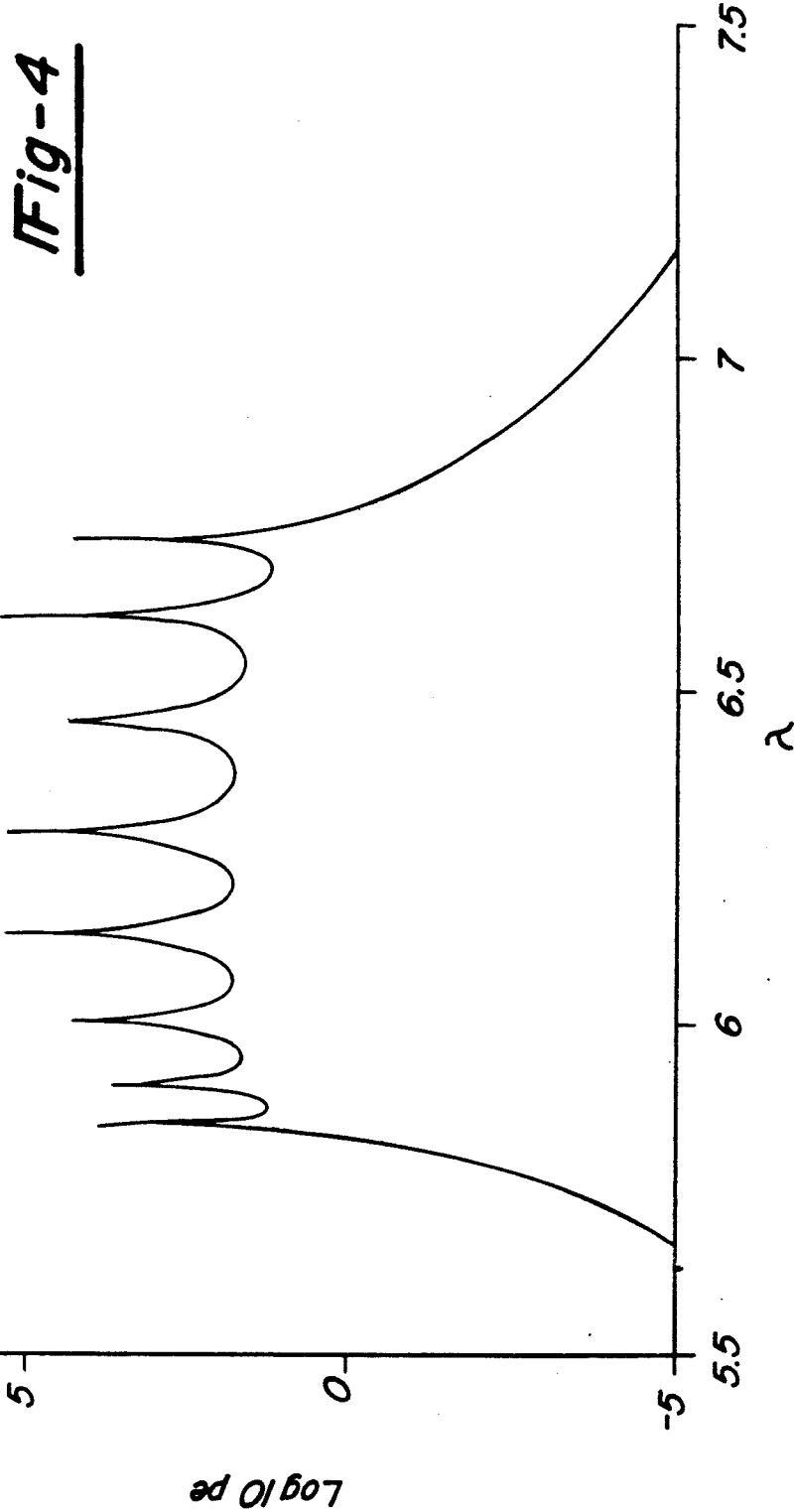

COMPOSITE QUANTUM WELL INFRARED DETECTOR

BACKGROUND OF THE INVENTION

1. Field of the Invention

This invention relates generally to a multiple quantum well infrared detector, and more particularly, to a multiple quantum well infrared detector incorporating a series of tightly coupled well groups.

2. Discussion of the Related Art

Infrared detectors have a wide range of applications typically for the detection of heat gradients in devices such as infrared security systems and thermal imaging systems. Known types of detectors include mercury cadmium telluride (HgCdTe) detectors and silicon extrinsic detectors for the detection of infrared photons. An HgCdTe infrared detector includes a P-I-N semiconductor which operates on the principle of detecting infrared photons by measuring electrons which are released from the valence band to the conduction band in the intrinsic layer from the absorption of the infrared photon energy. A silicon semiconductor detector also detects infrared radiation by absorption of infrared photons in which bound electrons in the impurity energy bands of the dopant atoms gain the absorbed photon energy. The electrons which absorb the photon energy are released into the conduction band enabling an electric field bias to direct the released electrons to specific terminal contacts where they can be measured. Both of these types of infrared detectors suffer the drawback that they cannot be effectively integrated with certain readout circuits incorporating field effect transistors (FET) which enable the detected photons to be imaged.

A multiple quantum well (MQW) infrared detector is known in the art which is able to integrate with the FET readout circuitry not compatible with the HgCdTe and silicon detectors discussed above. The conventional MQW is a single well device which incorporates an array of barrier and well layers, typically aluminum gallium arsenide (AlGaAs) and appropriately doped gallium arsenide (GaAs), in an alternating pattern forming a multiple of single well structures. A dopant electron bound in the well structure formed by the conduction band of the GaAs and AlGaAs must acquire enough energy from an absorbed infrared photon to reach the conduction band of the AlGaAs in order to be a free carrier measurable as induced current by infrared photon radiation. This single well type structure only provides a single allowable energy state within the well structure which can be occupied by an electron. This paucity of allowable energy states effects the likelihood that an electron will absorb enough photon energy to be released into the conduction band.

The conventional MQW, therefore, still suffers a number of drawbacks making it less efficient as a high performance infrared imaging device. Specifically, the single well MQW has a limited band width range of the infrared spectrum which it can detect. Further, the conventional MQW is substantially sensitive to the angle of incidence of the infrared photons. Consequently, the prior art MQW is limited as a high performance detector compatible with the circuitry of many readout devices, such as thermal imagers.

What is needed then is an infrared detector which is adaptable to readout circuitry, such as will be found in a thermal imager, and has a higher band width detection and is less sensitive to angle of incidence than its prior art counterpart. It is therefore an object of the present invention to provide such a detector.

SUMMARY OF THE INVENTION

Disclosed is a composite multiple quantum well infrared detector incorporating a plurality of tightly coupled well groups formed by a number of alternating barrier layers and well layers. In one preferred embodiment, the coupled wells are comprised of a series of alternating layers of GaAs and AlGaAs. In this arrangement the coupled wells are separated in groups between barrier layers of AlGaAs. At each end of the array of coupled wells are graded barrier layers providing sufficient ohmic contacts which enable the system to accept appropriate bias potentials and to be coupled to a desirable readout system for an imaging device. Each of the layers of GaAs and AlGaAs within the coupled well regions are generally only a few lattice layers thick.

In operation of the composite quantum well as defined above, an impinging photon will release an electron from the well region of the doped GaAs into the conduction energy band of the AlGaAs material. If the electron absorbs enough photon energy so that it can be released from the well region into the conduction band, it will act as a free carrier and add to the current flow of the device. Consequently, this current flow can be measured to determine the amount of incident infrared radiation. Since a bound electron is free to travel within the well region and the well walls are very thin, the electron is free to tunnel between the different well regions defined by the coupled well, and thus, it is able to exist in more energy states than would be possible in a single well structure. A configuration of this type enables the device to detect a broader band width, absorb more infrared photons and enable the structure to be integrated with imaging circuitry.

Additional objects, advantages, and features of the present invention will become apparent from the following description and appended claims, taken in conjunction with the accompanying drawings.

BRIEF DESCRIPTION OF THE DRAWINGS

FIG. 2 is an energy band diagram of the layer representation of the embodiment of FIG. 1;

FIG. 2(a) is an energy diagram of one section of the tightly coupled wells of FIG. 2; and FIGS. 3 and 4 are graphs which illustrate the broadening of the single energy level of an isolated well into a band of 8 levels for 8 tightly coupled wells. The wavelength shift between graphs 3 and 4 illustrates the effect of increased well doping.

DETAILED DESCRIPTION OF THE PREFERRED EMBODIMENTS

The following description of the preferred embodiments is merely exemplary in nature and is intended in no way to limit the invention or its application or uses.

Figure 1:
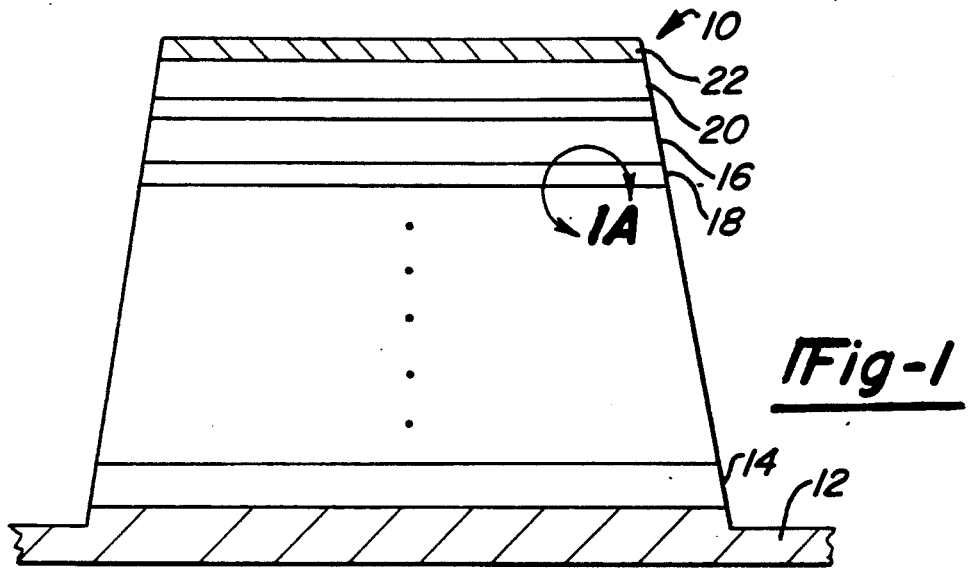
FIG. 1 is a sectional view of the layers of an infrared detector, according to one embodiment of the present invention.

First turning to FIG. 1, a sectional view of a composite MQW infrared detector 10, according to one preferred embodiment of the present invention, is shown. Detector 10 includes a bottom contact layer 12 on which a graded contact barrier layer 14, and a series of alternating blocking or barrier layers 16 and composite well layers 18 are formed. At the top of detector 10 opposite contact layer 12 a second graded contact barrier layer 20 and a contact layer 22 is formed.

Generally, contact layers 12 and 22 are formed of n-type doped GaAs ($\approx 2 \times 10^{18}$) at a thickness of approximately 1000 angstroms. Graded contact barrier layers 14 and 20 are AlGaAs having an undoped region adjacent the first barrier layers 16 and a doped region adjacent contact layers 12 and 22, respectively. The composition of the AlGaAs of layers 14 and 20 are such that the energy bands line up with the GaAs contact layer 12 and 22 and the barrier layers 16 as will be described below. Barrier layers 16 are generally formed of AlGaAs at 30% Al and 70% Ga, and act as an insulative region between composite well layers 18. Composite well layers 18 are formed of a plurality of alternating AlGaAs barrier layers and GaAs semiconductor layers as will be described hereunder.

Barrier layers 16 and well layers 18 are generally formed on contact layer 12 by a process such as molecular beam epitaxy, as is well known in the art. In FIG. 1, only one barrier layer 16 and two composite well layers 18 are shown. It will be understood, however, that the number of alternating layers 16 and 18 is not crucial to the invention, and will differ for specific applications.

In a preferred embodiment, the graded blocking layers 14 and 20, adjacent contacts 12 and 22, respectively are graded AlGaAs blocking layers to form an acceptable ohmic contact with the GaAs contact layers 12 and 22. During the epitaxial growth process, layers 14 and 20 will be doped at an edge proximate to contact layers 12 and 22 and graded with decreasing dopants until they reach the barrier layers 16. Such a procedure provides a good ohmic contact between contact layer 12 and 22 and the alternating barrier layers 16 and well layers 18 such that electrons can readily make the transition out of these alternating layers. In addition, to make this structure more applicable to be connected to certain readout circuitry, it is known to include a buffer layer (not shown) of AlGaAs on top of tact layer 22 and an active layer (not shown) of a high electron mobility transistor (HEMT) or other similar transistor, known to those skilled in the art. These added layers further are applicable to make detector 10 compatible with FET readout circuitry.

Contact layers 12 and 22 are positioned to accept a bias potential from a voltage source (not shown). For most applications of this type of device, the bias potential will be approximately one-half volt. Applying a bias potential creates an electric field between contact layers 12 and 22 by which free charge carriers released by infrared photons in the doped regions of layers 18 will transfer measurable charge, as will be described below.

Figure 1A:
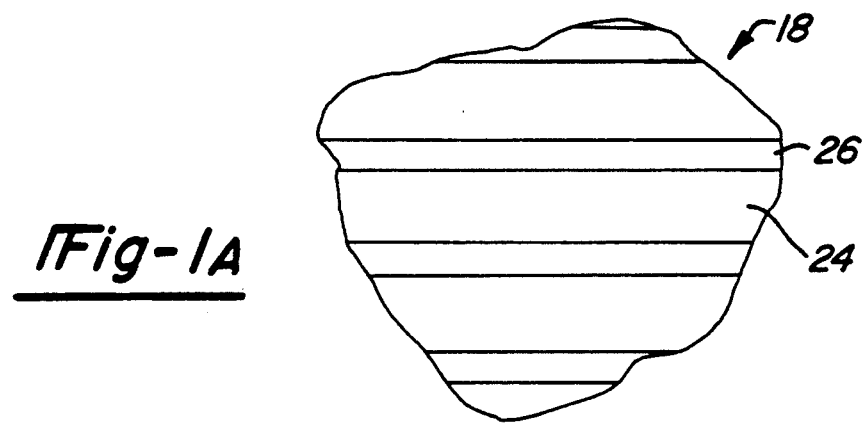
FIG. 1(a) is a layer representation of a coupled well section of one layer of the embodiment of FIG. 1.

FIG. 1(a) is a exploded view of one composite well layer 18 of FIG. 1. As is apparent, each composite layer 18 is formed of its own alternating layer configuration comprised of heavily doped n-type GaAs layers 24 and AlGaAs barrier layers 26. In one preferred embodiment, each composite well layer 18 includes eight GaAs layers 24. Noticeably, barrier layers 26 are about one-half the width of doped layers 24. Typical dimensions of each GaAs layer 24 is eight lattice layers wide, which is equal to approximately sixteen monolayers or atomic layers. A typical thickness of each AlGaAs layer 26 is five lattice layers or 10 monolayers. The GaAs layers 24 are appropriately doped with a density of approximately $2 \times 10^{18} - 1 \times 10^{19}$ dopant atoms, depending on specific applications. In this configuration, each layer 18 forms a tightly coupled composite well which has eight separate allowable energy bands (one for each well) as will be described below. The concentration of aluminum in the AlGaAs barrier layers is approximately 30% and the concentration of gallium is approximately 70%.

FIG. 2 shows a conduction band energy diagram 28 of infrared detector 10 as shown in FIG. 1. The bottom of the conduction band of contact layers 12 and 22 are shown as sections 34 and 36 of energy diagram 28. Sloped conduction band sections 38 and 40 represent the energy level of the contact barrier layers 14 and 20 adjacent the contact layers 12 and 22, respectively. Sections 42 and 44 of conduction band 28 represent the first AlGaA barrier layers 16 adjacent contact barrier layers 14 and 22. Section 30 of energy diagram 28 represents the composite well configuration of well layers 18. As is apparent, each section 30 contains eight closely coupled wells 46 and associated barriers 48. Conduction band wells 46 and associated barriers 48 represent GaAs well layers 24 and AlGaAs barrier layers 26, respectively. Section 32 represents the conduction band of the AlGaAs barrier layer 16 between each well layer 18.

Below the energy diagram 28, a number of dimensions are represented by reference letters. Namely, reference letter A represents the dimension of contact section 34 and is approximately 2000 angstroms wide. Reference letter B represents the part of the sloped section 38 which is doped relative to sections 34 and 36, and is approximately 180 angstroms wide. Reference letter C is the remaining distance of sloped section 38 which is undoped and is approximately 120 angstroms wide. Reference letter D represents the width of the first blocking section 42 before the first composite well and is generally about 300 angstroms wide. Reference letter E is the distance of each layer 16 represented by section 32 between the composite wells 18 and is generally about 850 angstroms wide. The opposite end of the energy line is set at approximately the same dimension.

FIG. 2(a) represents a blown up version of the energy band of the set of eight composite wells 30. Each well section 46 is the conduction band energy representation of GaAs and is represented by a distance F of approximately eight lattice layers wide. The barrier section 48 of the wells 46 are represented as the energy level of the conduction band of AlGaAs and is generally about five lattice layers wide as depicted by distance G. The valence band (not shown) is a certain energy distance below the well shaped conduction band of FIG. 2(a). For GaAs, this energy distance is approximately 1.5 electron volts from the bottom of the conduction band. For AlGaAs this distance is approximately 1.9 electron volts from the bottom of the conduction band. Approximately 80% of this difference is in the conduction band edge, the remainder is in the valence band edge. Therefore, the depth of the well is about 0.32 eV.

Typically for a single well, the well structure formed by the alternating layers of GaAs and AlGaAs will establish one allowable electron energy level within the well and a quasi-allowable electron energy level near the top of the well. If two of these wells are formed close enough together, then a dopant electron bound in the allowable energy state of one of the wells will be free to tunnel back and forth between the two wells and occupy either one of the two allowable energy levels. This type of behavior is represented by two allowable energy levels within a single well having a separate, but approximately the same, energy. In other words, the energy levels will be one on top of the other having a slightly different energy. Consequently, if eight wells are tightly coupled, as in the preferred embodiment discussed above, there are eight allowable energy levels, and electrons bound in any one of the wells can occupy any of the allowable states. Conceptually, this leads to a single well having a number of electrons in a range of energy levels. Therefore, there are more electrons which are able to absorb photon energy to be lifted to the conduction band of the device. This, in turn, leads to the ability of photons with lesser energy, those with longer wavelengths, to release a bound electron in the higher allowable states into the free electron states. The greater number of electrons also means the states are filled to higher quantum numbers leading to greatly improved absorption for photons travelling vertically.

The width of the well and the level of dopant electrons play significant roles in the range of photon wavelengths which can be detected. The width of the well sets the center frequency of the frequency range detectable by determining the lowest energy level of the conglomerate of acceptable energy levels within the well structure. By increasing the dopant, the allowable energy states are filled to a higher level and the average detectable wavelength is shifted within the band of wavelengths set by the width of the well. Therefore, the combination of the number of coupled wells plus the width of each well and the number of dopant electrons establishes the energy levels of the electrons relative to the top of the conduction band of the barriers, thus establishing the amount of extra energy needed to release an electron to be detected.

Figure 3:
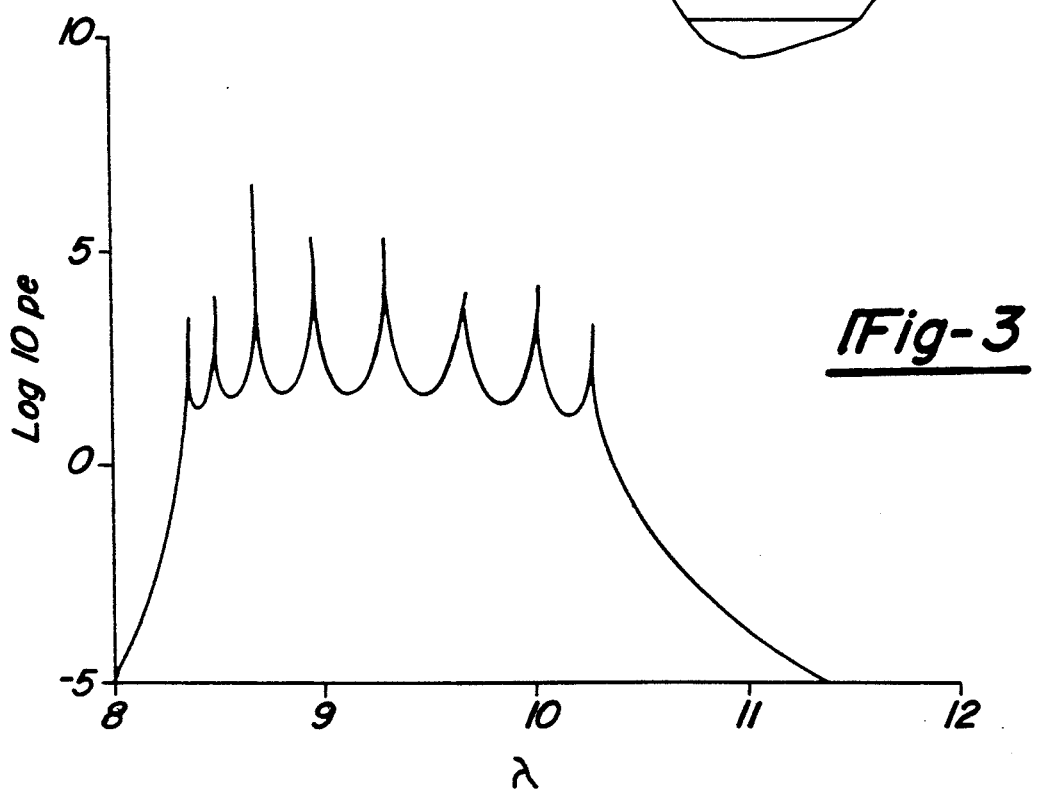

FIGS. 3 and 4 represent graphs of the detectable wavelength of an MQW detector according to one embodiment of the invention. The lower coordinate axis is the wavelength ($\lambda$) in microns ($10^{-6}$) of the infrared photons and the vertical axis (pe) is a logarithmic variable related to the probability of finding an electron at that energy value. FIG. 3 represents the band width detectable by an MQW according to one preferred embodiment of the present invention which has GaAs wells doped to $6 \times 10^{16}$ dopant atoms. FIG. 4 is the detectable infrared band gap of a MQW according to one preferred embodiment of the present invention in which the GaAs wells are doped to $2 \times 10^{18}$. As is apparent in both FIGS. 3 and 4, there are eight spikes representative of the eight different wells in the preferred embodiment.

In view of the discussion above, an MQW infrared detector is achievable which detects a substantially wider band width of infrared energy over its single well prior art counterpart. Since the detector incorporates GaAs and AlGaAs, the structure is readily adaptable to FET readout circuitry. Further, this arrangement of composite wells enables the detector to be more sensitive to detect infrared photons.

The foregoing discussion discloses and describes merely exemplary embodiments of the present invention. Oneskilled in the art will readily recognize from such discussion, and from the accompanying drawings and claims, that various changes, modifications can be made therein without departing from the spirit and scope of the invention as defined in the following claims.

What is claimed is:

1. A multiple quantum well infrared detector comprising:
   a first contact layer and a second contact layer; and
   an alternating configuration of blocking layers and composite quantum well structures formed between the first contact layer and the second contact layer, each of said composite quantum well structures including a plurality of alternating quantum well layers and barrier layers, each of the quantum well layers within a composite well structure being tightly coupled so as to allow electrons bound in the quantum well layers to tunnel relatively freely between each quantum well layer of the composite well structure, wherein each composite well structure includes eight doped quantum well layers, and wherein the quantum well layers are approximately sixteen monolayers thick and the barrier layers are approximately ten monolayers thick.

2. The infrared detector according to claim 1 wherein the quantum well layers are doped gallium arsenide and the barrier layers are undoped aluminum gallium arsenide.

3. The infrared detector according to claim 1 wherein the blocking layers are undoped aluminum gallium arsenide.

4. The infrared detector according to claim 1, wherein each of the first contact layer and the second contact layer are formed of a doped gallium arsenide layer and a graded aluminum gallium arsenide layer, said graded aluminum gallium arsenide layer including a section which is doped and a section which is substantially undoped such that the section which is doped is in contact with the doped gallium arsenide layer and the sections which is undoped is in contact with a blocking layer.

5. The infrared detector according to claim 4 wherein the doped gallium arsenide layer of the first contact layer and the second contact layer is approximately one thousand angstroms wide and has a dopant density of approximately $2 \times 10^{18}$ dopant atoms.

6. The infrared detector according to claim 1 further comprising a buffer layer formed on said second contact layer opposite to said alternating configuration of blocking structures and composite well layers.

7. The infrared detector according to claim 6 further comprising an active layer formed on top of said buffer layer opposite to the second contact layer.

8. The infrared detector according to claim 4 wherein the doped section of the graded contact layer is approximately 180 angstroms wide and the undoped section of the graded contact layer is approximately 120 angstroms wide.

9. The infrared detector according to claim 1 wherein the quantum well layers are doped gallium arsenide and the barrier layers are undoped aluminum gallium arsenide having an aluminum concentration of approximately 30%.

10. A multiple quantum well infrared detector comprising:
    a first contact layer and a second contact layer; and
    an alternating configuration of blocking layers and composite quantum well structures formed between the first contact layer and the second contact layer, each of said composite quantum well structures including a plurality of alternating doped gallium arsenide quantum well layers and undoped aluminum gallium arsenide barrier layers, each of the quantum well layers within a composite well structure being tightly coupled so as to allow electrons bound in the quantum well layers to tunnel relatively free between each quantum well layer of the composite well structure, wherein the quantum well layers are approximately 16 monolayers thick and the barrier layers are approximately 10 monolayers thick.

11. The infrared detector according to claim 10 wherein each of the first contact layer and the second contact layer are formed of a doped gallium arsenide layer and a graded aluminum gallium arsenide layer, said graded aluminum gallium arsenide layer being graded such that a portion of the graded aluminum gallium arsenide layer is in contact with the doped gallium arsenide layer and a portion of the graded aluminum gallium arsenide layer in contact with a blocking layer is undoped.

12. The infrared detector according to claim 10 wherein each composite quantum well structure includes eight doped quantum well layers.

* * * * *